(12) United States Patent
Sirito-Olivier et al.

(10) Patent No.: US 6,281,722 B1
(45) Date of Patent: *Aug. 28, 2001

(54) BIAS SOURCE CONTROL CIRCUIT

(75) Inventors: Philippe Sirito-Olivier, Grenoble; Colette Morche, Meylan, both of (FR)

(73) Assignee: SGS-Thomson Microelectronics S.A., Gentilly (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/493,851

(22) Filed: Jun. 22, 1995

(30) Foreign Application Priority Data

Jun. 27, 1994 (FR) .................................. 94 08119

(51) Int. Cl.[7] ...................................... G05F 3/02
(52) U.S. Cl. ...................... 327/142; 327/198; 327/545
(58) Field of Search .................... 327/142, 198, 327/538, 547, 543, 545, 546

(56) References Cited

U.S. PATENT DOCUMENTS

| | | | |
|---|---|---|---|
| 4,078,199 | * 3/1978 | Chapron et al. | 323/1 |
| 4,495,425 | * 1/1985 | McKenzie | 327/541 |
| 4,713,560 | 12/1987 | Herndon . | |
| 4,882,548 | * 11/1989 | Marrah et al. | 330/228 |
| 5,083,079 | * 1/1992 | Plants | 323/313 |
| 5,111,069 | * 5/1992 | Deierling et al. | 327/566 |
| 5,155,384 | 10/1992 | Ruetz . | |
| 5,218,238 | 6/1993 | Nonaka et al. . | |
| 5,243,231 | * 9/1993 | Baik | 327/546 |
| 5,300,822 | * 4/1994 | Sugahara et al. | 327/142 |
| 5,426,398 | * 6/1995 | Kuo | 331/57 |

* cited by examiner

Primary Examiner—Terry D. Cunningham
(74) Attorney, Agent, or Firm—Wolf, Greenfield & Sacks, P.C.; James H. Morris; Theodore E. Galanthay

(57) ABSTRACT

The invention relates to a control circuit for a bias source including a stand-by device and a starting-aid device, with their respective outputs connected to a control input of the bias source, the starting-aid device including a switch to inhibit its operation, controlled by the bias source, said circuit including capacitive means for reactivating the starting-aid device when the "Stand-by" control signal changes state, indicating that the bias source should be reactivated.

10 Claims, 2 Drawing Sheets

BIAS SOURCE CONTROL CIRCUIT

BACKGROUND OF THE INVENTION

1. Field of the Invention

The present invention relates to a bias source control circuit including stand-by means.

This application is related to an application entitled DEVICE FOR SETTING A BIAS SOURCE AT PARTIAL STAND-BY AND CONTROL CIRCUIT FOR SUCH A SOURCE and to an application entitled DEVICE FOR SETTING A BIAS SOURCE AT STAND-BY, both filed on even date herewith, and incorporated herein by reference.

2. Discussion of the Related Art

Stand-by devices are used to reduce power consumption in a circuit during periods of non-use by deactivating the bias source, without it being necessary to switch off the circuit. They are of particular interest for systems with an independent power supply, consisting of, for example, ordinary or rechargeable batteries, such as remote sensors. The role of such sensors is, for example, to transmit data to a control panel in the case of a change in the state of the sensor. In such devices, it is essential to limit the consumption of the sensor during periods when its state is stable. In order to do this, the bias source of its emission units is set at stand-by when the sensor is in a stable state for a predetermined time interval. This enables the power consumption of the device to be reduced during these periods. The bias source is restarted, or reactivated as soon as the stand-by control signal changes state, giving an indication that the sensor no longer is in a stable state.

A bias source start-up aid device is usually implanted in the control circuit, to allow the bias source to be started up. Such a device generally operates independently of the stand-by device, and it is only used when a voltage is applied to the circuit for the initial start-up of the bias source after its complete extinction, and is then electrically disconnected from the bias source. Conventionally, the bias source is thus never completely switched off during its stand-by periods. The existing stand-by devices reduce circuit consumption and maintain the bias source in its active state, otherwise the control circuit would no longer have means to restart the bias source, these means having been inhibited after a voltage has been applied to the circuit.

A drawback of these existing circuits is that they continue to consume power even during stand-by periods of the bias source. This consumption is due to the residual consumption of the source during its stand-by periods, and to that of the start-up aid device.

Additionally, there is a transient consumption at the switching of the circuit from a nominal operation state to a stand-by state of bias source 1. Indeed, such a control circuit conventionally includes a logic device including CMOS inverters. The role of the inverters is to produce a signal, which corresponds to a logic signal for the control circuit, from a stand-by control signal that is received by the control circuit. During the transition of the stand-by control signal between a state corresponding to non-stand-by to a state corresponding to stand-by, the current that flows through the inverters reaches a peak that falls following the fall of the stand-by control signal. Thus, useless power is consumed at the switching of the inverters.

Moreover, the stand-by control signal, although generally being a logic signal, frequently varies between two potentials that do not necessarily correspond to the bias source supply potentials. In this case, from the view-point of the bias source, the stand-by control signal is not a logic signal. As a consequence, a current flows through the logic device during the whole period when the bias source is deactivated, which results in a significant residual consumption of power. This consumption is all the more important as the difference between the low state potential of the stand-by control signal and the potential of the negative terminal of the supply voltage is important.

Such power consumptions reversibly affect the autonomy of independently supplied systems, but cannot be avoided in conventional circuits, particularly because the bias source cannot be totally switched off during stand-by periods, because it is necessary to be able to reactivate it.

SUMMARY OF THE INVENTION

The invention aims at overcoming these drawbacks by providing a bias source control circuit which prevents any power consumption during the bias source stand-by periods, allowing at the same time the bias source to return to its nominal operation state. It also aims at limiting the consumption periods of the control circuit to the switching periods of the bias source.

To achieve at least this object, the present invention provides a bias source control circuit including a stand-by device and a start-up aid device having respective outputs connected to a control input of the bias source, the start-up aid device including a switch for inhibiting its operation, controlled by the bias source, the circuit including capacitive means for reactivating the start-up aid device when the stand-by control signal changes state, thus indicating that the bias source should be reactivated.

According to an embodiment of the invention, said capacitive means include a capacitor connected between an input of the control circuit receiving the stand-by control signal, and a first control input of the start-up aid device.

According to an embodiment of the invention, the control circuit also includes means for deactivating the stand-by and start-up aid devices during bias source stand-by periods.

According to an embodiment of the invention, the stand-by device includes a p-channel MOS transistor whose source is connected to a positive terminal of a supply voltage, and whose drain constitutes an output of the stand-by device, connected to the control input of the bias source, the gate of the p-channel MOS transistor receiving the stand-by control signal.

According to an embodiment of the invention, the start-up aid device includes two n-channel MOS transistors connected as a current mirror between a negative supply terminal of the bias source, and the drain of a p-channel MOS transistor and the output of the stand-by device, respectively; the source of the p-channel MOS transistor being connected to the positive supply terminal, its gate constituting a second control input of the start-up aid device; the gates of the n-channel MOS transistors being connected to the drain of the p-channel MOS transistor, which constitutes the first control input of the start-up aid device; and the drain of the n-channel MOS transistor connected to the output of the stand-by device constituting the output of the start-up aid device transmitted on the control input of the bias source.

According to an embodiment of the invention, the switch for inhibiting the start-up aid device includes an n-channel MOS transistor located between the first control input of the start-up aid device and the negative supply terminal of the bias source, the gate of this transistor being connected to an output of the bias source.

According to an embodiment of the invention, the control circuit further includes a logic device receiving the stand-by control signal on one input, and an output of which is connected to the second control input of the start-up aid device, said logic device including at least a first inverter with an active load controlled by the bias source.

According to an embodiment of the invention, the logic device includes a second inverter controlled by the bias source, an input of the second inverter being connected to an output of the first inverter.

According to an embodiment of the invention, the control of the second inverter by the bias source includes two MOS transistors; an n-channel transistor, the source of which is connected to the negative terminal of the supply voltage and the gate of which is connected to the output of the bias source, being connected, through its drain, to the drain of a p-channel MOS transistor, itself diode-connected and connected as a current mirror to a p-channel transistor of the second inverter.

According to an embodiment of the invention, the logic device further includes at least a third CMOS inverter, an input of which receives an output of the second inverter and an output of which constitutes the output of the logic device transmitted to the second control input of the start-up aid device.

The provision of means for reactivating the start-up aid device allows setting the bias source at stand-by by thoroughly switching it off, which limits its power consumption during stand-by periods. These means for reactivating allow forcing conduction in the bias source when it is at an inactive stable state induced by a stand-by control signal.

The provision of means for deactivating the devices of the bias source control circuit when the bias source is at stand-by allows essentially reducing the power consumption of the control circuit. The autonomy of the system in which it is implanted is thus increased.

Using an inverter with an active load controlled by the bias source itself for constituting the logic device makes the duration of the peak of current at the switching of the inverter independent of the switching time of the stand-by control signal. Thus, the width of the peak of current is reduced insofar as it disappears as soon as the bias source is deactivated. Moreover, all residual consumption is prevented in the logic device in the case where the potentials of the logic states of the stand-by control signal differ from the potentials of the bias source supply voltage.

The controlling of the second inverter of the logic device by the bias source enables deactivation of this inverter during bias source stand-by periods.

The foregoing and other objects, features and advantages of the present invention will be discussed in detail in the following description of specific embodiments, taken in conjunction with the accompanying drawings but not limited by them.

DETAILED DESCRIPTION

Figure 1:
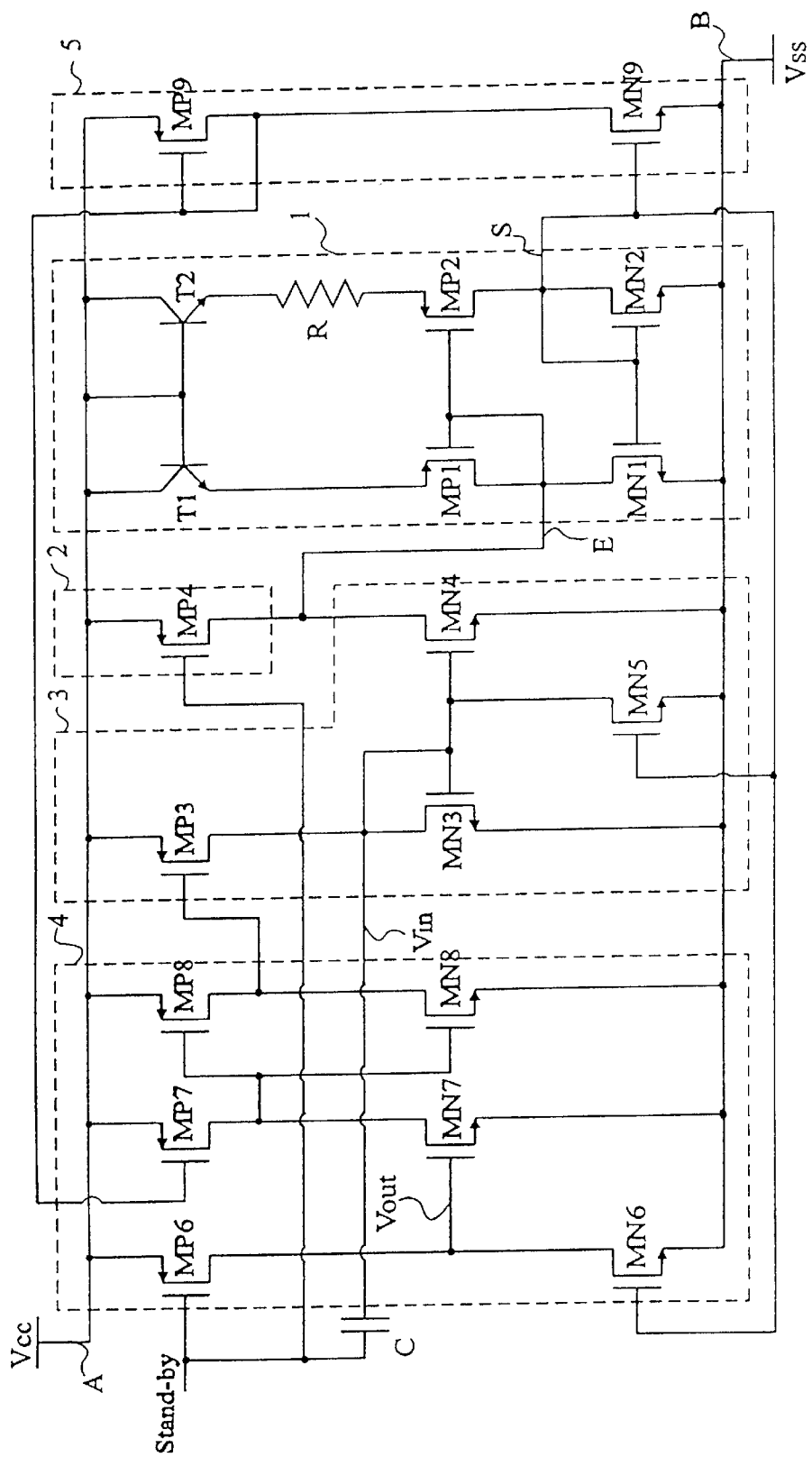
FIG. 1 shows an embodiment of a bias source control circuit according to the invention.

As shown in FIG. 1, a control circuit for a bias source 1, according to the invention, includes three devices. A device 2 for setting bias source 1 at stand-by by completely canceling its power consumption, a start-up aid device 3 for bias source 1, and a logic device 4 with an active load.

Bias source 1 is supplied between two terminals A, B at potentials Vcc, Vss of a supply voltage provided, for example, by a battery (not shown). A "Stand-by" control signal is received by the control circuit.

Bias source 1 may, for instance, be a $\Delta Vbe/R$ bias source. Such a bias source 1 is, for instance, constituted by transistors connected as current mirrors and a biasing resistor R. Two NPN bipolar transistors T1, T2 have their collectors and their bases connected to positive terminal A, at potential Vcc, of a supply voltage. The emitter of transistor T1 is connected to the source of a p-channel MOS transistor MP1. The emitter of transistor T2 is connected to the source of a p-channel MOS transistor MP2, via biasing resistor R. These two upper MOS transistors MP1, MP2 are connected as a current mirror and have their gates connected to the drain of transistor MP1. The drain of each transistor MP1, MP2 is respectively connected to the drain of an n-channel MOS transistor MN1, MN2, the source of which is connected to the negative terminal B, at potential Vss, of the supply voltage.

The gates of these lower MOS transistors MN1, MN2, that are also connected as a current mirror, are connected together to the drain of transistor MN2 which constitutes an output terminal S of bias source 1. The role of such a bias source 1 is to activate the biasing of one or more units in a circuit in which it is implanted, by reproducing the current that flows through it at a current source of the unit. This current source is, for instance, constituted by a MOS transistor connected as a current mirror with the lower transistors MN1, MN2 of bias source 1.

A $\Delta Vbe/R$ bias source has two stable states. In a first, so-called active state, a current flows in each of branches T1, MP1, MN1 and T2, R, MP2, MN2 of bias source 1. In a second, so-called inactive state, no current flows in branches T1, MP1, MN1 and T2, R, MP2, MN2 of bias source 1. This bistable mode operation is linked with the drain-source voltages of MOS transistors MP1, MN1, MP2, MN2 that block the bias source in its inactive state. As a matter of fact, these transistors are blocked as long as their gates are not brought to a predetermined potential which is, with respect to their source potential, lower in the case of a p-channel transistor, higher in the case of an n-channel transistor, by a value corresponding to the threshold voltage VT of the transistor. Similarly, once they conduct, they will be maintained so as long as their gate potential does not reach this predetermined potential. So bias source 1 must be able to be activated, or started up, when a voltage is applied to the circuit. This initial activation is achieved by using start-up aid device 3 which will be described below.

When bias source 1 is activated, the current that flows through it is proportional to the difference between the base-emitter voltage of bipolar transistors T1, T2, and inversely proportional to biasing resistance R. As a matter of fact, when bias source 1 is active and balanced, that is when the currents that flow in each of its branches T1, MP1, MN1 and T2, R, MP2, MN2 are equal, current Ib in each branch equals $\Delta Vbe/R$. $\Delta Vbe$ stands for the difference Vbe1–Vbe2 between the base-emitter voltages of transistors T1, T2.

This bias source 1 has a control input E constituted by the drains of transistors MP1, MN1, that are connected to the outputs of the stand-by and start-up aid devices 2 and 3.

Start-up aid device 3 includes four MOS transistors MP3, MN3, MN4, MN5. The source of p-channel MOS transistor MP3 is connected to terminal A, whereas its gate, which constitutes a second control input of start-up aid device 3, is connected to the output of logic device 4. The drain of transistor MP3 is connected to the drain of n-channel MOS transistor MN3, connected as a diode with its gate to its drain. The source of transistor MN3 is connected to terminal B. The drains of transistors MP3, MN3, which constitute a first control input Vin of start-up aid device 3, are also connected to the gate of n-channel MOS transistor MN4, the source of which is connected to terminal B. That is, transistor MN4 is connected as a current mirror with transistor MN3. The drain of transistor MN4, which constitutes the output of start-up aid device 3, is connected to the drains of transistors MP1, MN1, which are the control input E of bias source 1.

The gates of transistors MN3, MN4 are also connected to the drain of n-channel transistor MN5. The source of transistor MN5 is connected to terminal B and its gate is connected to output S of bias source 1. That is, transistor MN5 is connected as a current mirror with lower MOS transistors MN1, MN2 of bias source 1.

A first role of the start-up aid device 3 is to ensure that bias source 1 switches from its inactive state to its active state when a voltage is applied to the circuit. This first role is disclosed below whereas a second role of the start-up aid device 3 will be explained further on, in connection with the setting of bias source 1 at stand-by.

When a voltage is applied to the circuit, transistor MP3 conducts. It is assumed that the "Stand-by" signal is at its high state V+ associated with non-stand-by. The gate potential of transistors MN3, MN4 is thus at potential Vcc, minus the voltage drop in the series resistance of transistor MP3. Since the sources of the two transistors MN3, MN4 are at potential Vss, these transistors MN3, MN4 are also conducting. Transistor MN4 then biases the gates of transistors MP1, MP2 at potential Vss, plus the voltage drop in the series resestance of transistor MN4. Thus, transistors MP1, MP2 turn on, and through the connection between the gates of transistors MN1, MN2 with the drain of transistor MP2, transistors MN1, MN2 also turn on. Bias source 1 is then in its active stable state.

At that moment, the currents that flow through transistors MN1, MN2 are imbalanced due to the conduction of transistor MN4. However, when bias source 1 has started up, transistor MN5 turns on as it is connected as a current mirror with transistors MN1, MN2. This causes turning-off of transistor MN4, that no longer draws current from bias source 1, which balances the currents flowing through its branches. Transistor MN5 plays the role of a switch for inhibiting start-up aid device 3.

To set the bias source at stand-by, the "Stand-by" signal is used to operate stand-by device 2.

This stand-by device 2 is constituted by a p-channel MOS transistor MP4 that receives the "Stand-by" control signal on its gate. The source of this transistor MP4 is connected to terminal A of the supply voltage, whereas its drain is connected to control input E of bias source 1.

At the coming of a request for stand-by, represented by a change in state of the "Stand-by" signal from its high state V+ to its low state V−, the gate biasing of transistor MP4 is modified. Consequently, this transistor MP4 turns on, which biases the gates of transistors MP1, MP2 of bias source 1 at potential Vcc, minus the voltage drop in the series resistance of transistor MP4. Thus, the bias source is deactivated by the blocking of transistors MP1, MP2.

The inactive state of bias source 1 being a stable state, bias source 1 will remain inactive even if transistor MP4 turns of f due to a new switching of the "Stand-by" signal. This is caused by the means that will be described further on in connection with the description of logic device 4 and that are implemented to limit the consumption of the circuit during switching. The restarting, or reactivating, of bias source 1 is caused by start-up aid device 3. The second role of start-up aid device 3 will now be described.

The drains of transistors MP3, MN3 which constitute the first input Vin of start-up aid device 3 are connected to the input of the control circuit receiving the "Stand-by" signal via a capacitor C. The transition of the "Stand-by" signal from its low state to its high state is thus used to bias the gates of transistors MN3, MN4 and thus cause a restarting of bias source 1. Capacitor C has a double role. On the one hand, it avoids short-circuiting transistor MN5 between potential Vss and potential V+ of the "Stand-by" signal, which would cause significant power consumption. On the other hand, it avoids that transistors MP4 of stand-by device 2 and MN4 of start-up aid device 3 constitute a CMOS inverter of the "Stand-by" signal.

The constitution of logic device 4, which has a double role, will be described further on. On the one hand, it changes the "Stand-by" signal into a logic signal from the viewpoint of start-up aid device 3. On the other hand, it allows to rapidly deactivate start-up aid device 3 by the "Stand-by" control signal, when bias source 1 returns to its nominal operation.

Logic device 4 is constituted by three inverters including MOS transistors MP6, MN6, MP7, MN7, MP8, MN8. A first inverter of logic device 4 comprises two MOS transistors MP6, MN6, with n-channel MOS transistor MN6 as an active load controlled by bias source 1. P-channel MOS transistor MP6 is connected with its source to terminal A of the supply voltage, whereas its gate receives the "Stand-by" control signal. The drain of transistor MP6 is connected to the drain of n-channel MOS transistor MN6, the source of which is connected to terminal B of the supply voltage. The gate of transistor MN6 is connected to output terminal S of bias source 1. In other words, transistor MN6 is connected as a current mirror with the two lower transistors MN1, MN2 of bias source 1. The drains of transistors MP6, MN6 are the output Vout of the first inverter of logic device 4, which is transmitted to a second inverter including MOS transistors.

This second inverter includes two MOS transistors MP7, MN7. The n-channel MOS transistor MN7 receives output Vout of the first inverter on its gate, whereas its source is connected to terminal B of the supply voltage. The drain of transistor MN7 is connected to the drain of p-channel MOS transistor MP7, the source of which is connected to terminal A of the supply voltage. The gate of transistor MP7 is biased as a function of output S of bias source 1, by using a pair of transistors MP9, MN9. These transistors MP9, MN9 constitute an output stage 5 of bias source 1 which will be described later on, in connection with the operation of the control circuit. The drains of transistors MP7, MN7 constitute the output of the second inverter of logic device 4 which is transmitted to a third inverter including MOS transistors.

This third inverter is a conventional CMOS inverter. It includes two MOS transistors MP8, MN8, the gates of which are connected together to the drains of transistors MP7, MN7. The source of p-channel MOS transistor MP8 is connected to terminal A of the supply voltage, whereas its drain is connected to the drain of n-channel transistor MN8. The source of transistor MN8 is connected to terminal B of the supply voltage. The drains of transistors MP8, MN8 constitute the output of this third inverter and of logic device 4, which is transmitted to the gate of transistor MP3 constituting the second control input of start-up aid device 3. The geometry chosen for this CMOS inverter is such that it can switch rapidly.

The need to rapidly control transistor MP3 of start-up aid device 3, when a transition of the "Stand-by" signal occurs, is linked with the geometry of transistor MP3. Transistor MP3 is chosen to offer a high series resistance in order to limit its consumption outside the stand-by periods of bias source 1. Therefore, it has a high gate capacity that requires a fast transmission of current when a stand-by control signal appears, if a fast control is desired.

The control circuit according to the invention allows deactivation of bias source 1 by completely eliminating its power consumption, without adversely affecting its restart. Besides, it eliminates any power consumption during the stand-by periods and limits the consumption periods of the devices it includes to the switching periods of bias source 1.

Figure 2:
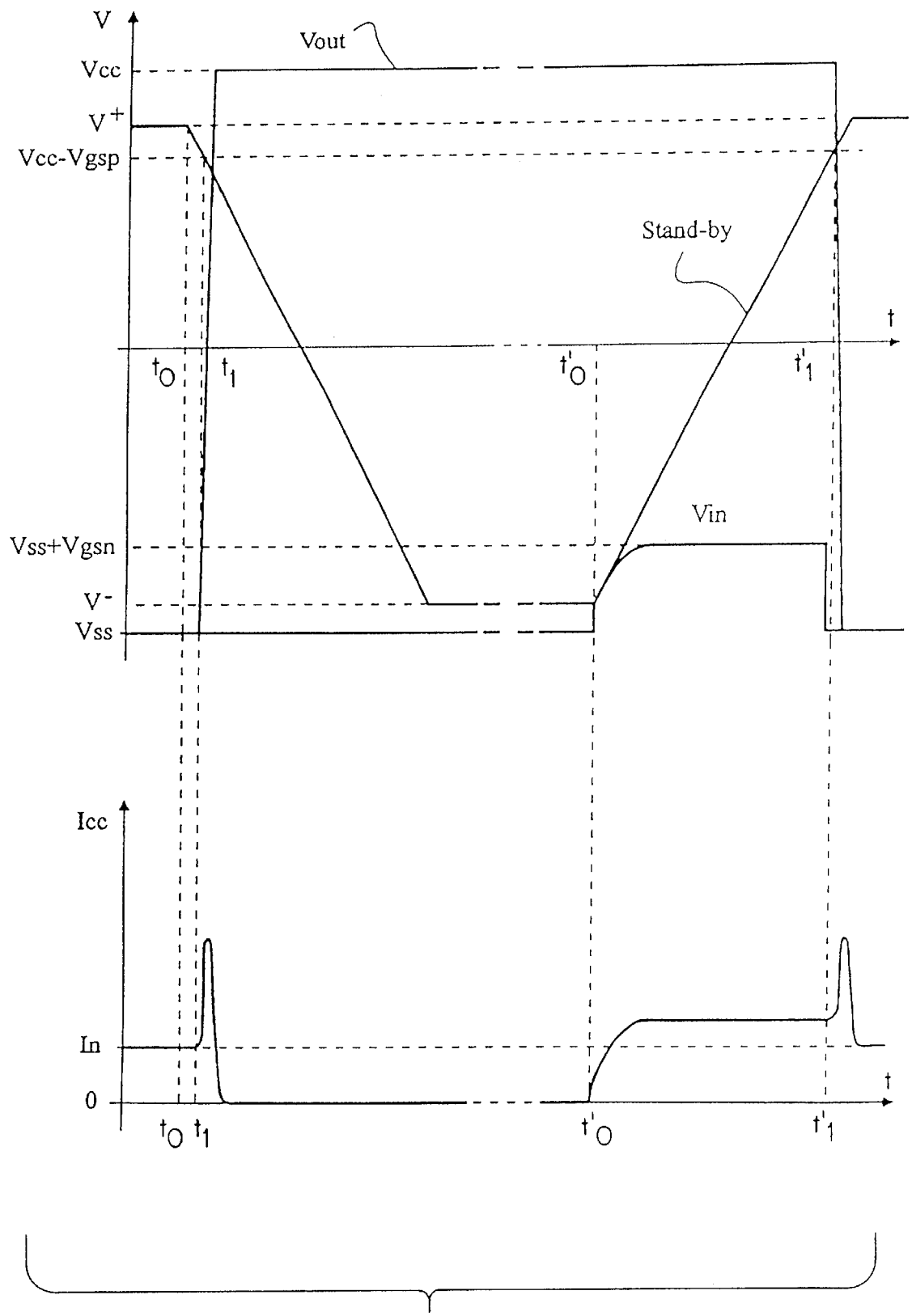
FIG. 2 shows two timing diagrams representing the most significant voltages and currents of the circuit illustrated in FIG. 1 when the bias source is set at stand-by and reactivated.

This operation is illustrated by FIG. 2, which shows two timing diagrams representing the potential of the "Stand-by" signal, of output Vout of the first inverter of logic device 4, and of input Vin of the start-up aid device, and the current Icc consumed by the whole circuit.

When there is no stand-by control signal at the control circuit input, it is assumed that the "Stand-by" signal is at a high state corresponding to potential V+. Bias source 1 being in its active state, transistors MP1, MP2, MN1, MN2 are on.

As has been seen before, transistor MN5 is on, and both transistors MN3, MN4 are off. Thus, no current flows through start-up aid device 3. Similarly, no current flows through stand-by device 2.

The "Stand-by" signal being at its high state, transistor MP6 is off and no current flows through the first inverter of logic device 4. It is therefore assumed that potential V+ of the high state of the "Stand-by" signal is between potential Vcc and potential Vcc−Vgsp, where Vgsp is the gate-source threshold voltage of a p-channel MOS transistor, in this case that of transistor MP6. All MOS transistors of the same type are assumed to have the same gate-source threshold voltage, insofar as they are all on a same integrated circuit chip. The start-up threshold of the first inverter can be lowered and thus allow operation with a "Stand-by" signal with a lower V+ potential, by inserting one or several p-channel MOS transistors, connected as diodes, between transistor MP6 and terminal A.

At time $t_0$, the "Stand-by" signal starts a transition toward its low state V−, indicating a request for stand-by. As long as the "Stand-by" signal has not reached value Vcc−Vgsp, the formerly described situation does not change. The consumed current Icc corresponds to the current in bias source 1, which is at its nominal value In set by the ΔVbe/R.

From time t1, when the "Stand-by" signal reaches value Vcc−Vgsp, transistor MP6 turns on. Since transistor MN6 is on, the current which flows through it attains a peak to join the current of bias source 1 on which it is mirrored. At the same time t1, transistor MP4 turns on, which causes turning-off of transistors MP1, MP2 and the setting bias source 1 at stand-by. From then on, no current flows through bias source 1.

The deactivating of bias source 1 causes the turning-off of all transistors MN5, MN6, MN9 that are connected as current mirrors with transistors MN1, MN2. The turning-off of transistor MN5 frees the gates of transistors MN3, MN4 of start-up aid device 3 which thus becomes available to reactivate bias source 1 if needed.

The turning-off of transistor MN6 cancels the current in transistor MP6 which thus cannot follow the slope of the "Stand-by" signal. Thus, the consumption in the first inverter is reduced by making its peak consumption time independent of the switching time of the "Stand-by" signal. This consumption inside the inverter stops as soon as bias source 1 is deactivated. Besides, no residual consumption remains, even for a high state potential V+ and a low state potential V− of the "Stand-by" signal that differ from the potentials of terminals A and B. Its power consumption is thus reduced during switching.

The turning-off of transistor MN9 causes the turning-off of transistor MP7, through its control by bias source 1. Transistor MP7 is controlled by output stage 5. This output stage is constituted by two MOS transistors MP9, MN9. The source of p-channel MOS transistor MP9 is connected to terminal A, whereas its gate is connected to the gate of p-channel MOS transistor MP7 and its drain is connected to its own gate and to the drain of n-channel MOS transistor MN9. That is, transistor MP9 is diode-connected and connected as a current mirror with transistor MP7. The source of transistor MN9 is connected to terminal B and its gate is connected to output terminal S of bias source 1. That is, transistor MN9 is connected as a current mirror with lower transistors MN1, MN2 of bias source 1. Thus, when bias source 1 is deactivated, transistors MN9 and MP9 no longer conduct. Therefore, no current can flow through transistor MP7. Transistor MP3, through the third inverter of logic device 4, then turns off.

Any consumption of current is prevented during the stand-by periods of bias source 1. This result is obtained whatever the value of potential V− of the low state of the "Stand-by" control signal is, as long as it remains under Vcc−Vgsp.

When the "Stand-by" control signal starts a transition toward its high state, indicating that bias source 1 should be reactivated, the inverse switching occurs as follows.

At time t'0, when the "Stand-by" signal starts its transition toward potential V+, potential Vin at the input of start-up aid device 3 follows the "Stand-by" signal potential through capacitor C, and is limited to value Vss+Vgsn, where Vgsn stands for the gate-source threshold voltage of an n-channel MOS transistor, in this case transistor MN3. Since the gate of transistor MN4 is at potential Vss+Vgsn, this transistor turns on. As transistor MP4 is also on, a current then flows through transistors MN3, MP3, and MN4.

At time t'1, when the "Stand-by" signal potential reaches value Vcc−Vgsp, transistors MP4, MP6 turn off. Thus, transistor MN4 can again lower the gate potential of transistors MP1 and MP2, which causes bias source 1 to restart.

Once bias source 1 has restarted, transistors MN5, MN6, MN9 are on again.

The conduction of transistor MN6 biases the gate potential of transistor MN7 to potential Vss, plus the voltage drop in the series resistance of transistor MN6.

The conduction of transistor MN5 biases the gate potential of transistor MN4 to potential Vss, plus the voltage drop in the series resistance of transistor MN5. Therefore, this causes transistor MN4 to turn off, which balances the currents flowing through the branches of bias source 1.

The conduction of transistor MN9 reactivates logic device 4, through transistor MP9, and thus transistor MP3 turns on, which restarts start-up aid device 3.

Regarding current Icc, no current is consumed, neither by the control circuit, nor by bias source 1, before time t'0.

Between times t'0 and t'1, the consumption corresponds to the current flowing through transistors MN3, MP4, MN4. At time t'1, when bias source 1 restarts, a peak p associated with the switching of the transistors occurs. Then the consumption represents the current In absorbed by bias source 1 alone.

As a matter of fact, once bias source 1 has restarted, devices 2 and 4 of the control circuit are deactivated again, as far as their consumption of current is concerned.

Thus, the consumption of current of these devices 2 and 4 is limited to the switching periods of bias source 1.

To allow an optimal operation of the control circuit according to the invention, capacitor C is chosen so as to cause a steep edge of the transition of the stand-by control signal. Since transistor MP4 plays the role of a switch, it should have a low series resistance to be able to deactivate bias source 1 when a stand-by control signal appears. In other words, a transistor with a high gate width will be selected. In order to limit the consumption of start-up aid device 3 during nominal operation periods of bias source 1, transistor MP3 will be selected so as to have a very low W/L ratio. That is, it will have a much greater gate length than its gate width. Along the same lines, the peak amplitude of the current can be limited at the switching of the first inverter of logic device 4, by dimensioning transistor MN6 with a lower W/L ratio than that of transistor MN2 of bias source 1.

Of course, the present invention can have various alternative embodiments and modifications which will appear to those skilled in the art. Particularly, the selection of the ratios between gate lengths and widths depends on the use for which the bias source is meant. Similarly, each of the described components can be replaced by one or several elements with the same role.

Such alterations, modifications, and improvements are intended to be part of this disclosure, and are intended to be within the spirit and the scope of the invention. Accordingly, the foregoing description is by way of example only and is not intended to be limiting. The invention is limited only as defined in the following claims and the equivalent thereto.

What is claimed is:

1. A control circuit for a bias source, the control circuit including:
   a stand-by device, having an output connected to a control input of the bias source, to deactivate the bias source in response to a stand-by control signal;
   a start-up aid device which activates the bias source, having an output connected to the control input of the bias source, and including a switch for inhibiting the operation of the start-up aid device when the bias source is active;
   capacitive means, receiving the stand-by control signal and connected to a first control input of the start-up aid device, for reactivating the start-up aid device when the stand-by control signal starts a transition toward a state to reactivate the bias source; and
   a logic device having an input receiving the stand-by control signal and an output connected to a second control input of the start-up device, adapted to activate the start-up aid device when an inactive level of the stand-by control signal is provided to the control circuit.

2. The control circuit according to claim 1, wherein the capacitive means includes a capacitor connected between an input of the control circuit receiving the stand-by control signal, and the first control input of the start-up aid device.

3. The control circuit according to claim 1, wherein the switch of the start-up aid device also inhibits the stand-by device and enables the start-up aid device to be reactivated during an inactive state of the bias source.

4. The control circuit according to claim 1, wherein said stand-by device includes a p-channel MOS transistor having a source connected to a positive terminal of a supply voltage, having a drain constituting an output of the stand-by device, and receiving the stand-by control signal.

5. The control circuit according to claim 1, wherein the start-up aid device comprises a p-channel MOS transistor having a source connected to a positive supply terminal, and a drain and a gate constituting respectively the first control input and a second control input of the start-up aid device; and two n-channel MOS transistors connected as a current mirror between a negative supply terminal of the bias source, and, respectively, a first control input of the start-up aid device and the control input of the bias source.

6. The control circuit according to claim 4, wherein the switch for inhibiting the start-up aid device includes an n-channel MOS transistor, located between the first control input of the start-up aid device and the negative supply terminal, a gate of the n-channel MOS transistor being connected to an output of the bias source.

7. The control circuit according to claim 1, wherein the logic device includes at least a first inverter with an active load controlled by the bias source.

8. The control circuit according to claims 7, wherein the logic device includes a second inverter controlled by a control means therein responsive to the bias source, and an input of the second inverter being connected to an output of the first inverter.

9. The control circuit according to claim 8, wherein the control means of the second inverter includes an n-channel transistor having a source connected to the negative supply terminal, a gate connected to the output of the bias source, and a drain of a p-channel MOS transistor of the second inverter connected to a drain of a p-channel MOS transistor therein which is diode-connected as a current mirror with the p-channel MOS transistor of the second inverter.

10. The control circuit according to claim 8, wherein the logic device further includes at least a third CMOS inverter having an input which receives an output of the second inverter, and an output which constitutes the output of the logic device.

* * * * *

UNITED STATES PATENT AND TRADEMARK OFFICE
CERTIFICATE OF CORRECTION

PATENT NO. : 6,281,722 B1
DATED : August 28, 2001
INVENTOR(S) : Philippe Sirito-Olivier and Colette Morche It is certified that error appears in the above-identified patent and that said Letters Patent is hereby corrected as shown below:

<u>Column 5,</u>
Line 36, should read as follows: series resistance of transistor MN4. Thus, transistors MP Signed and Sealed this Twenty-sixth Day of February, 2002

Attest:

JAMES E. ROGAN
*Attesting Officer*     *Director of the United States Patent and Trademark Office*